United States Patent
Ungar

(10) Patent No.: US 6,711,199 B2
(45) Date of Patent: Mar. 23, 2004

(54) LASER DIODE WITH AN INTERNAL MIRROR

(75) Inventor: Jeffrey E. Ungar, Valley Village, CA (US)

(73) Assignee: Quintessence Photonics, Sylmar, CA (US)

( * ) Notice: Subject to any disclaimer, the term of this patent is extended or adjusted under 35 U.S.C. 154(b) by 0 days.

(21) Appl. No.: 10/163,859

(22) Filed: Jun. 5, 2002

(65) Prior Publication Data

US 2002/0186738 A1 Dec. 12, 2002

Related U.S. Application Data

(60) Provisional application No. 60/296,630, filed on Jun. 6, 2001.

(51) Int. Cl.$^7$ .............................. H01S 3/16; H01S 3/098
(52) U.S. Cl. ........................................ 372/50; 372/18
(58) Field of Search ............................ 372/18, 21, 22, 372/43, 50

(56) References Cited

U.S. PATENT DOCUMENTS

| | | | |
|---|---|---|---|
| 4,856,017 A | | 8/1989 | Ungar |
| 5,175,643 A | * | 12/1992 | Andrews ................... 359/339 |
| 5,228,049 A | * | 7/1993 | Paoli ........................ 372/50 |
| 5,231,642 A | | 7/1993 | Scifres et al. |
| 5,561,676 A | * | 10/1996 | Goldberg ..................... 372/18 |
| 5,657,339 A | * | 8/1997 | Fukunaga ..................... 372/50 |
| 5,710,788 A | | 1/1998 | Werner |
| 5,715,268 A | * | 2/1998 | Lang et al. ................... 372/50 |
| 5,793,521 A | * | 8/1998 | O'Brien et al. ............. 359/344 |
| 5,802,084 A | * | 9/1998 | Bowers et al. ................ 372/18 |
| 5,835,261 A | * | 11/1998 | Tamanuki et al. .......... 359/344 |
| 5,864,574 A | * | 1/1999 | Welch et al. .................. 372/50 |
| 5,912,910 A | * | 6/1999 | Sanders et al. ............... 372/22 |
| 5,914,978 A | | 6/1999 | Welch et al. |
| RE37,051 E | * | 2/2001 | Welch et al. ................. 372/50 |
| RE37,354 E | * | 9/2001 | Welch et al. ................. 372/50 |

* cited by examiner

*Primary Examiner*—Paul Ip
*Assistant Examiner*—Phillip Nguyen
(74) *Attorney, Agent, or Firm*—Irell & Manella LLP

(57) ABSTRACT

A semiconductor laser that has a distributed feedback laser section and an amplifier section. The amplifier section may be tapered to lower the optical power density particularly at an output facet of the laser. The semiconductor laser also includes a reflective element that reflects light from the distributed feedback laser section to the amplifier section. The reflective element folds the optical path of the light beam. Folding the optical path allows the amplifier section area to be increased without enlarging the semiconductor die size. The larger amplifier section will increase the output power of the laser. Likewise, the reflective element will allow the semiconductor die size to be reduced without decreasing the optical power of the laser.

22 Claims, 1 Drawing Sheet

LASER DIODE WITH AN INTERNAL MIRROR

REFERENCE TO CROSS RELATED APPLICATION

This application claims priority under 35 U.S.C §119(e) to provisional Application No. 60/296,630 filed on Jun. 6, 2001.

BACKGROUND OF THE INVENTION

1. Field of the Invention

The subject matter disclosed generally relates to the field of semiconductor lasers.

2. Background Information

Semiconductor lasers are used in a variety of system applications. For example, semiconductor lasers are used as a light source in fiber optic communication systems. It is generally desirable to provide a semiconductor laser that has a high power output. High power output reduces the number of repeaters and amplifiers required for the optical system.

Increasing the power of a semiconductor laser can result in higher optical power densities in the laser. High power densities can cause damage to the laser, particularly at the output mirror, reducing the useful lifetime of the device. Additionally, high optical power density can lead to non-linear effects in the laser beam. The non-linear effects degrade the quality of the beam and the overall performance of the optical system. The optical power density can be lowered by increasing the width of the active light-generating section. Unfortunately, widening this section may cause the laser to emit light in a multiplicity of lateral modes, thereby degrading the optical quality of the laser's output.

U.S. Pat. No. 4,856,017 issued to Ungar discloses a semiconductor laser that has a distributed feedback laser section and an amplifier section. The distributed feedback laser section includes a diffraction grating for generating a coherent beam of light. The coherent light beam is then amplified in the amplifier section. The amplifier section is tapered so that the output facet is relatively wide. The wide output facet reduces the optical power density at the facet. The lower optical power density improves the life of the semiconductor laser and the quality of the resulting light beam.

Further increasing the power of the Ungar semiconductor laser would require enlarging the amplifier section and the overall size of the die. Enlarging the die increases the cost of mass producing the semiconductor laser and reduces its efficiency. It would be desirable to increase the output power of the semiconductor laser without enlarging the die. Conversely, it would also be desirable to reduce the die size without reducing optical power.

BRIEF SUMMARY OF THE INVENTION

A semiconductor laser that includes a distributed feedback laser section and an amplifier section. The semiconductor laser also includes a reflective element located along an optical path between the distributed feedback laser section and the amplifier section.

DETAILED DESCRIPTION

Disclosed is a semiconductor laser that has a distributed feedback laser section and an amplifier section. The amplifier section may be tapered to lower the optical power density particularly at an output facet of the laser. The semiconductor laser also includes a curved reflective element that reflects light from the distributed feedback laser section to the amplifier section. The reflective element folds the optical path of the light beam and widens the beam. Folding the optical path allows the amplifier section area to be increased without enlarging the semiconductor die size and spreads the optical power over a wider area. The larger amplifier section will increase the output power of the laser. Likewise, the reflective element will allow the semiconductor die length to be reduced without decreasing the optical power of the laser.

Figure 1:
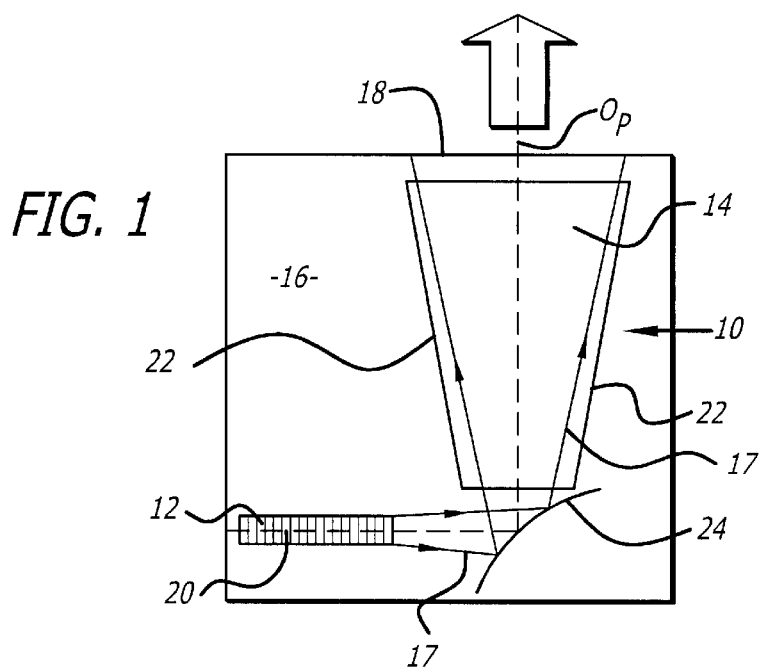
FIG. 1 is an illustration of a semiconductor laser.

Referring to the drawings more particularly by reference numbers, FIG. 1 shows a semiconductor laser 10. The semiconductor laser 10 includes a distributed feedback laser section 12 and an amplifier section 14 located within a semiconductor die 16. The distributed feedback laser section 12 generates a coherent light beam 17. The coherent light beam 17 travels along an optical path $O_p$ to the amplifier section 14. The amplifier section 14 amplifies and increases the optical power of the coherent light beam 17. The amplified light beam exits an output facet 18 of the laser 10.

The distributed feedback laser section 12 may include a diffration grating 20. Although a grating 20 is shown and described, it is to be understood that the distributed feedback section 12 may have other means for generating coherent light. For example, the laser section 12 may be a distributed Bragg reflector.

The amplifier section 14 preferably includes a pair of tapered edges 22 that are widest near the output facet 18. The edges are tapered in order to most efficiently match the broadening profile of the optical beam. The semiconductor laser 10 can be used to generate high optical output power in the range of 5 watts.

The semiconductor laser 10 includes a reflective element 24 that reflects the light beam 17 from the distributed feedback laser section 12 to the amplifier section 14. The reflective element 24 may be a convex diverging mirror. The reflective element 24 folds the optical path $O_p$ and broadens the optical beam so that the width of the amplifier section 14 can be increased without changing the length of the die 16. The larger amplifier section 14 will increase the output power of the semiconductor laser 10.

Figure 2:
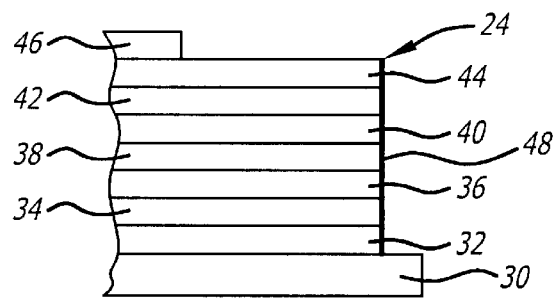
FIG. 2 is an illustration showing the layers of the semiconductor laser.

FIG. 2 shows the different layers 30, 32, 34, 36, 38, 40, 42, 44 and 46 of an embodiment of the semiconductor laser 10. The laser 10 may include a lower cladding 32 formed on a substrate 30. The substrate 30 may be an n-doped Indium Phosphide (InP) or Gallium Arsenide (GaAs) material. The cladding 32 may be an n-doped InP or GaAs material.

The laser 10 may further have a multi-quantum well active layer 36 located between confinement layers 34 and 38. Confinement layer 34 may be a n-doped InGaAsP or $Al_yGa_{1-y}As$ material. Confinement layer 38 may be a p-doped InGaAsP or $Al_yGa_{1-y}As$ material. Layers 40, 42 and 44 may be upper cladding that includes p-doped material. For example, layer 40 may be p-doped InGaAsP or $Al_xGa_{1-x}As$. Layer 42 may be p-doped InGaAsP or $Al_zGa_{1-z}As$ material. Layer 44 may be p-doped InP or $Al_xGa_{1-x}As$ material. Layer 46 may be an electrical contact layer containing $p^+$-doped InGaAs or GaAs material.

The layers 34, 36 and 38 create a PN junction that will generate stimulated light emission in response to a flow of electrical current. Cladding layers 32, 40, 42 and 44 form a waveguide that guides the light. The grating within the distributed feedback laser section 12 is typically formed within layers 34, 36 and 38. Current is passed through both the distributed feedback laser section 12 and the amplifier section 14 through contacts located on these section 12 and 14. The current causes stimulated emission in the distributed feedback laser section 12 where coherent light is formed. The current causes further stimulated emission within the amplifier section 14 which increases the optical power of the laser 10.

The semiconductor laser 10 can be constructed by initially forming layers 32, 34, 36 and 38 on the substrate 30. A grating can then be formed in the distributed feedback laser section 12 of layers 34, 36 and 38. The remaining layers 40, 42, 44 and 46 can then be sequentially formed onto layer 38. All the layers can be formed with known epitaxial semiconductor fabrication processes.

A portion of layers 32, 34, 36, 38, 40, 42 and 44 are etched to form the reflective element 24. The air-die interface will create a reflective plane. Additionally, a layer of reflective material 48 may be coated onto the air-die interface to improve the reflectivity of the element 24. Alternatively, a lens (not shown) may be formed in the die to reflect and refocus the light generated in the distributed feedback laser section.

Figure 3:
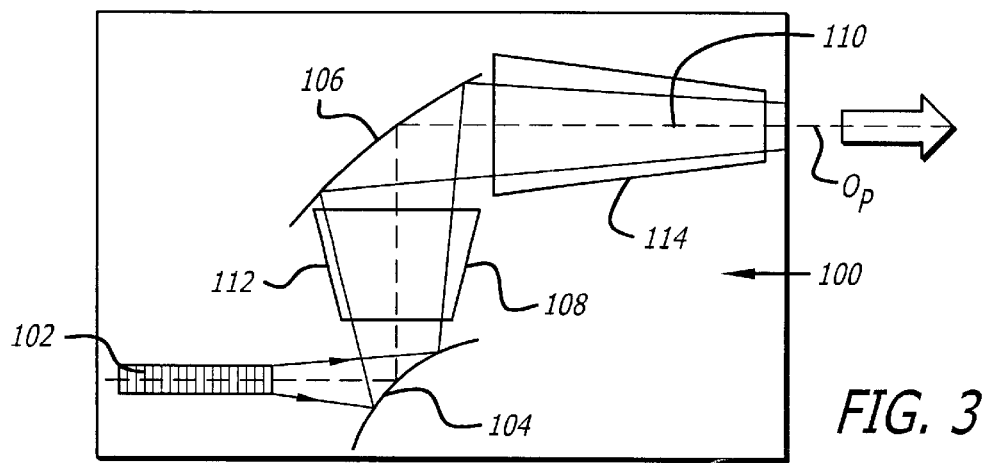
FIG. 3 is an illustration of an alternate embodiment of the semiconductor laser.

FIG. 3 shows an alternate embodiment of a semiconductor laser 100. The laser 100 includes a distributed feedback laser section 102, a first reflective element 104, a second reflective element 106 and a pair of amplifier sections 108 and 110. The first reflective element 104 may be a convex diverging mirror. The second reflective element 106 may be a concave converging mirror. The combination of diverging and converging mirrors will provide an output beam that is focused in two planes. Having only one converging mirror as shown in the embodiment of FIG. 1, may result in an astigmatic output beam.

Although two amplifier sections 108 and 110 are shown, it is to be understood that the semiconductor laser 100 may have only one amplifier section 108 or 110, or more than two amplifier sections. Amplifier section 108 may have diverging tapered edges 112 that correspond to the diverging beam reflected by reflective element 104. Likewise, amplifier section 110 may have converging edges 114 that correspond to the converging beam reflected by reflective element 106.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor laser device, comprising:
   a distributed feedback laser section that generates a coherent beam of light;
   a first tapered optical power amplifier section; and,
   a first highly element that reflects the coherent beam of light from said distributed feedback laser section to said first tapered optical power section.

2. The semiconductor laser device of claim 1, wherein said distributed feedback laser section includes a grating.

3. The semiconductor laser device of claim 1, wherein said distributed feedback laser section includes a distributed Bragg reflector.

4. The semiconductor laser device of claim 1, wherein said first tapered optical amplifier section has a width that varies along the optical path.

5. The semiconductor laser device of claim 1, wherein said first highly reflective element is a diverging mirror.

6. The semiconductor laser device of claim 1, further comprising an output surface and a second highly reflective element located in the optical path between first highly reflective element and said output surface.

7. The semiconductor laser device of claim 6, wherein said second highly reflective element is a converging mirror.

8. The semiconductor laser device of claim 6, further comprising a second optical amplifier section located in the optical path between said second reflective mirror and said output surface.

9. The semiconductor laser device of claim 8, wherein said second optical amplifier section has a width that varies along the optical path.

10. The semiconductor laser device of claim 5, wherein said diverging mirror includes a layer of reflective material.

11. A semiconductor laser device, comprising:
    distributed feedback laser means for generating a coherent beam of light;
    amplifier means for optically amplifying the coherent beam of light; and,
    reflective means for reflecting the coherent beam of light from said distributed feedback laser means to said amplifier means.

12. The semiconductor laser device of claim 11, wherein said distributed feedback laser means includes a grating.

13. The semiconductor laser device of claim 11, wherein said distributed feedback laser means includes a distributed Bragg reflector.

14. The semiconductor laser device of claim 11, wherein said amplifier means has a width that varies along an optical path.

15. The semiconductor laser device of claim 11, wherein said reflective means includes a diverging minor.

16. The semiconductor laser device of claim 15, wherein said reflective means includes a converging mirror.

17. The semiconductor laser device of claim 16, wherein said amplifier means includes a first amplifier section and a second amplifier section.

18. The semiconductor laser device of claim 17, wherein said first and second amplifier sections each have a width that varies along an optical path.

19. The semiconductor laser device of claim 15, wherein said diverging mirror includes a layer of reflective material.

20. A method for operating a semiconductor laser device, comprising:
    generating a coherent beam of light within a distributed feedback laser section;
    reflecting the coherent beam of light within a semiconductor laser with a highly reflective element; and,
    amplifying the coherent beam of light within a tapered optical power amplifier section.

21. The method of claim 20, wherein the coherent beam of light is reflected by a diverging mirror.

22. The method of claim 21, wherein the coherent beam of light is further reflected by a converging mirror.

* * * * *

UNITED STATES PATENT AND TRADEMARK OFFICE
CERTIFICATE OF CORRECTION

PATENT NO.   : 6,711,199 B2
DATED        : March 23, 2004
INVENTOR(S)  : Jeffrey E. Ungar It is certified that error appears in the above-identified patent and that said Letters Patent is hereby corrected as shown below:

Column 3,
Line 61, replace the phrase "a first highly element" with the phrase -- a first highly reflective element --.

Signed and Sealed this

Twenty-first Day of September, 2004

JON W. DUDAS
*Director of the United States Patent and Trademark Office*